United States Patent
Kato et al.

(10) Patent No.: US 6,753,560 B2
(45) Date of Patent: Jun. 22, 2004

(54) SEMICONDUCTOR MEMORY AND METHOD FOR DRIVING THE SAME

(75) Inventors: Yoshihisa Kato, Otsu (JP); Yasuhiro Shimada, Muko (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 553 days.

(21) Appl. No.: 09/891,214

(22) Filed: Jun. 26, 2001

(65) Prior Publication Data

US 2001/0054732 A1 Dec. 27, 2001

(30) Foreign Application Priority Data

Jun. 27, 2000 (JP) .......................... 2000-192475

(51) Int. Cl.[7] .............................................. H01L 29/76
(52) U.S. Cl. ........................................ 257/295; 257/288
(58) Field of Search ................................. 257/288, 295, 257/314, 319, 316, 3, 7, 318, 320, 321, 322, 323, 324, 325, 326

(56) References Cited

U.S. PATENT DOCUMENTS

| | | |
|---|---|---|
| 5,345,414 A | 9/1994 | Nakamura |
| 5,615,144 A | 3/1997 | Kimura et al. |
| 6,459,110 B1 * | 10/2002 | Tani |
| 2001/0038117 A1 * | 11/2001 | Haneder et al. |

FOREIGN PATENT DOCUMENTS

| | | |
|---|---|---|
| JP | 08-097386 | 4/1996 |
| JP | 08-316440 | 11/1996 |
| JP | 2643908 | 5/1997 |

* cited by examiner

*Primary Examiner*—Nathan J. Flynn
*Assistant Examiner*—Kevin Quinto
(74) *Attorney, Agent, or Firm*—McDermott, Will & Emery

(57) ABSTRACT

A semiconductor memory of this invention is composed of an MFMIS transistor including a first field effect transistor and a ferroelectric capacitor formed on or above the first field effect transistor with a gate electrode of the first field effect transistor working as or being electrically connected to a lower electrode of the ferroelectric capacitor, an upper electrode of the ferroelectric capacitor working as a control gate and the first field effect transistor having a first well region; and a second field effect transistor having a second well region that is isolated from the first well region of the first field effect transistor. The first well region of the first field effect transistor is electrically connected to the source region of the second field effect transistor, and the gate electrode of the first field effect transistor is electrically connected to the drain region of the second field effect transistor.

6 Claims, 5 Drawing Sheets

FIG. 2

|  | OPERATION | |
|---|---|---|
|  | WRITE | READ |
| WL1 | 0 | 0 |
| SL1 | 0 | 0 |
| GL1 | $\pm V_p$ | $V_r$ |
| BL1 | 0 | $V_d$ |
| RL1 | 0 | $V_p$ |
| V1 | $V_p$ | $V_p$ |
| W1 | 0 | 0 |
| WL2 | $V_p$ | $V_p$ |
| SL2 | 0 | 0 |
| GL2 | 0 | 0 |
| BL2 | 0 | 0 |
| RL2 | $V_p$ | $V_p$ |
| V2 | $V_p$ | $V_p$ |
| W2 | 0 | 0 |

SEMICONDUCTOR MEMORY AND METHOD FOR DRIVING THE SAME

BACKGROUND OF THE INVENTION

The present invention relates to a semiconductor memory composed of an MFMIS transistor including a ferroelectric capacitor formed on or above a field effect transistor and a method for driving the semiconductor memory.

An MFMIS transistor including a ferroelectric capacitor formed on or above a field effect transistor has a Metal/Ferroelectric/Metal/Insulator/Semiconductor multi-layer structure. The MFMIS transistor is formed in either of the following two known structures: In the first structure, as shown in FIG. 5A, the MFMIS transistor includes dopant diffusion layers 101 serving as a source and a drain formed in surface portions of a semiconductor substrate 100, and a floating gate 103, a ferroelectric film 104 and a control gate 105 successively formed above the semiconductor substrate 100 with a gate insulating film 102 sandwiched therebetween, namely, the gate electrode of the field effect transistor also works as the lower electrode of the ferroelectric capacitor; and in the second structure, as shown in FIG. 5B, the MFMIS transistor includes dopant diffusion layers 111 serving as a source and a drain formed in surface portions of a semiconductor substrate 110, a gate electrode 113 formed above the semiconductor substrate 110 with a gate insulating film 112 sandwiched therebetween, a floating gate 116 formed in an interlayer insulating film 114 covering the gate electrode 113 and connected to the gate electrode 113 through a contact plug 115, a ferroelectric film 117 formed on the floating gate 116 and a control gate 118 formed on the ferroelectric film 117, namely, the gate electrode of the field effect transistor is electrically connected to the lower electrode of the ferroelectric capacitor.

Now, a data erase operation, a data write operation and a data read operation of a conventional semiconductor memory including the MFMIS transistor will be described.

First, in the data erase operation, negative potential is applied to the semiconductor substrate, so as to apply a voltage between the control gate of the MFMIS transistor and the semiconductor substrate. Thus, polarization of ferroelectric films of the MFMIS transistors of all memory cells is turned along one direction, thereby erasing data stored in all the memory cells.

Next, in the data write operation, a voltage is applied between the substrate and the control gate of the MFMIS transistor of a memory cell disposed at an address selected by a writing transistor, so as to reverse the polarization direction of the ferroelectric film of this transistor (to place it in an on-state) or the polarization direction of the ferroelectric film of the transistor is kept (to place it in an off-state) without applying the voltage between the control gate and the substrate. Specifically, a data is written by causing either of two kinds of polarized states, that is, to reverse the polarization (which corresponds to an on-state) and to keep the polarization (which corresponds to an off-state), in accordance with the input data. Since the polarized state of the ferroelectric film is kept without applying a voltage, the memory cell functions as a nonvolatile semiconductor memory.

In the data read operation, a reading transistor is turned on, so as to detect voltage drop accompanied by a current flowing through the channel region of the field effect transistor included in the MFMIS transistor to a ground line (namely, a drain-source current). Since the channel resistance is varied depending upon the polarized state of the ferroelectric film of the MFMIS transistor, a data written in the MFMIS transistor can be thus read.

Since the ferroelectric capacitor (with capacitance $C_f$) and the capacitor (with capacitance $C_g$) of the field effect transistor are serially connected to each other in the MFMIS transistor, a voltage applied to the ferroelectric capacitor is merely a part of the voltage applied between the control gate and the semiconductor substrate, which corresponds to a voltage obtained by dividing the applied voltage by the reciprocal of the capacitance.

Therefore, in order to reverse the polarization of the ferroelectric film to write a data (in a data program), a voltage $(C_f+C_g)/C_g$ times as large as a voltage necessary for reversing the polarization of the ferroelectric film (namely, polarization reversing voltage) should be applied between the control gate and the semiconductor substrate. Therefore, a voltage necessary for data write is unavoidably high.

As a countermeasure, Japanese Laid-Open Patent Publication No. 8-97386 describes that a voltage applying transistor is connected to the floating gate of the MFMIS transistor so as to externally apply a writing voltage through the voltage applying transistor to the floating gate.

Since a voltage can be thus independently applied between the control gate and the floating gate, the voltage necessary for data write can be lowered.

The structure described in Japanese Laid-Open Patent Publication No. 8-97386 requires, however, two systems of voltage supply means, namely, one including a voltage supply and a voltage supply line for supplying a voltage to the control gate and the other including a voltage supply and a voltage supply line for supplying a voltage to the floating gate. Therefore, there arises another problem that the circuit configuration is so complicated that the structure of the entire semiconductor memory becomes complicated.

SUMMARY OF THE INVENTION

In consideration of the aforementioned conventional problems, an object of the invention is lowering a voltage necessary for data write with a simple structure.

In order to achieve the object, the semiconductor memory of this invention comprises an MFMIS transistor including a first field effect transistor and a ferroelectric capacitor formed on or above the first field effect transistor with a gate electrode of the first field effect transistor working as or being electrically connected to a lower electrode of the ferroelectric capacitor, an upper electrode of the ferroelectric capacitor working as a control gate and the first field effect transistor having a first well region; and a second field effect transistor having a second well region that is isolated from the first well region of the first field effect transistor, and the first well region of the first field effect transistor is electrically connected to a source region of the second field effect transistor, and the gate electrode of the first field effect transistor is electrically connected to a drain region of the second field effect transistor.

In the semiconductor memory of this invention, the first well region of the first field effect transistor is electrically connected to the source region of the second field effect transistor, and the gate electrode of the first field effect transistor is electrically connected to the drain region of the second field effect transistor. Therefore, the first well region and the gate electrode of the first field effect transistor are connected to each other through the source region and the drain region of the second field effect transistor. As a result, when the second field effect transistor is in an on-state, the first well region and the gate electrode of the first field effect transistor are short-circuited.

Accordingly, when the first well region and the gate electrode of the first field effect transistor are short-circuited by turning on the second field effect transistor in writing a data in the MFMIS transistor, a voltage applied between the control gate and the first well region of the MFMIS transistor can be sufficiently equal to a voltage for reversing polarization of the ferroelectric film of the ferroelectric capacitor.

In this manner, a voltage necessary for data write can be lowered in the semiconductor memory of this invention with a simple structure.

In the semiconductor memory, the first field effect transistor, the second field effect transistor and a driving circuit for driving the first and second field effect transistors are preferably formed on one semiconductor substrate, and a driving voltage supplied to the driving circuit and a DC voltage supplied to the second well region of the second field effect transistor are preferably supplied from one voltage supply.

In this case, there is no need to generate a DC voltage supplied to the second well region of the second field effect transistor, and hence, the structure of a DC voltage generation circuit formed on the semiconductor substrate can be simplified. As a result, the consumption power can be reduced and the semiconductor substrate can be downsized.

In the semiconductor memory, the first well region of the first field effect transistor and the second well region of the second field effect transistor preferably have different conductivity types.

In this manner, the driving voltage supplied to the driving circuit and the DC voltage supplied to the second well region of the second field effect transistor can be easily supplied from the same voltage supply. Therefore, the DC voltage generation circuit formed on the semiconductor substrate can be definitely simplified.

The method of this invention for driving a semiconductor memory composed of an MFMIS transistor including a first field effect transistor and a ferroelectric capacitor formed on or above the first field effect transistor with a gate electrode of the first field effect transistor working as or being electrically connected to a lower electrode of the ferroelectric capacitor, an upper electrode of the ferroelectric capacitor working as a control gate and the first field effect transistor having a first well region, and a second field effect transistor having a second well region that is isolated from the first well region of the first field effect transistor, the first well region of the first field effect transistor being electrically connected to a source region of the second field effect transistor and the gate electrode of the first field effect transistor being electrically connected to a drain region of the second field effect transistor, comprises the steps of writing a data in the MFMIS transistor by applying a voltage between the control gate and the first well region of the first field effect transistor with the second field effect transistor placed in an on-state; and reading a data from the MFMIS transistor by detecting change of channel resistance of the first field effect transistor with the second field effect transistor placed in an off-state.

In the method for driving a semiconductor memory of this invention, in writing a data in the MFMIS transistor, a voltage is applied between the control gate and the first well region of the first field effect transistor with the second field effect transistor placed in an on-state, namely, with the first well region and the gate electrode of the first field effect transistor short-circuited. Therefore, the voltage applied between the control gate and the first well region of the MFMIS transistor can be sufficiently equal to a voltage for reversing polarization of the ferroelectric film of the ferroelectric capacitor.

Accordingly, in the method for driving a semiconductor memory of this invention, a voltage necessary for data write can be lowered with a simple structure.

In the method for driving a semiconductor memory, a driving voltage supplied to a driving circuit for driving the first and second field effect transistors and a DC voltage supplied to the second well region of the second field effect transistor are preferably supplied by one voltage supply.

In this manner, there is no need to generate a DC voltage supplied to the second well region of the second field effect transistor, and hence, a DC voltage generation circuit formed on the semiconductor substrate can be simplified. As a result, the consumption power can be reduced and the semiconductor substrate can be downsized.

In the method for driving a semiconductor memory, the first well region and the second well region preferably have different conductivity types.

In this manner, the driving voltage supplied to the driving circuit and the DC voltage supplied to the second well region of the second field effect transistor can be easily supplied from the same voltage supply. Therefore, the DC voltage generation circuit formed on the semiconductor substrate can be definitely simplified.

BRIEF DESCRIPTION OF THE DRAWINGS

FIG. 2 is a diagram of applied voltages in a write operation and a read operation of a memory cell of the memory cell array in which the memory cells each including the semiconductor memory of the embodiment are arranged in the form of a matrix;

DETAILED DESCRIPTION OF THE INVENTION

A semiconductor memory and a method for driving the semiconductor memory according to a preferred embodiment of the invention will now be described with reference to FIGS. 1 through 4.

Figure 1:
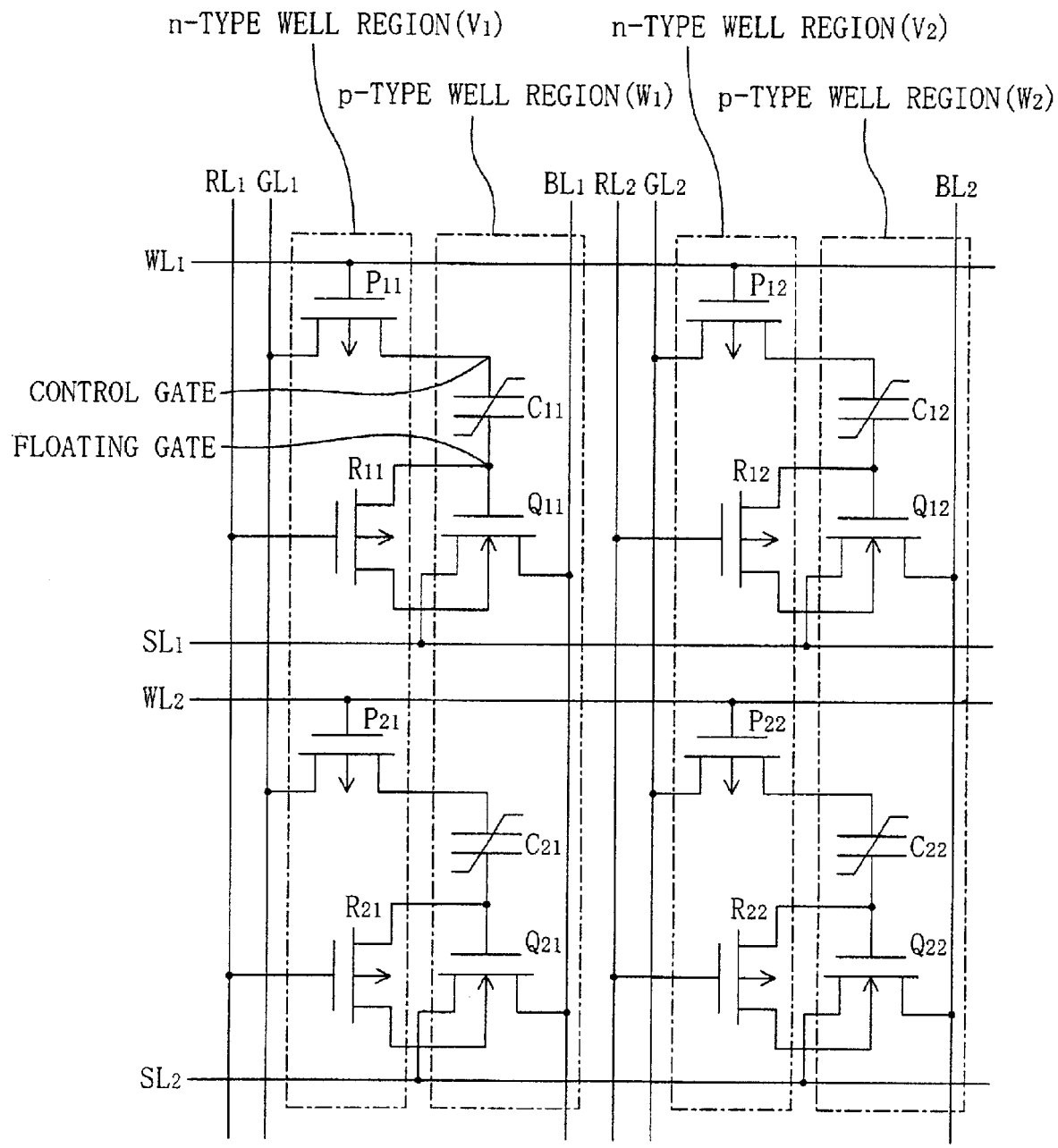
FIG. 1 is a plane view of a memory cell array in which memory cells each including a semiconductor memory according to an embodiment of the invention are arranged in the form of a matrix.

FIG. 1 shows the plane structure of a memory cell array in which memory cells each including the semiconductor memory of this embodiment are arranged in the form of a 2×2 matrix. In FIG. 1, $WL_1$ and $WL_2$ denote word lines, $SL_1$ and $SL_2$ denote source lines, $RL_1$ and $RL_2$ denote reset lines, $GL_1$ and $GL_2$ denote operation voltage supply lines, $BL_1$ and $BL_2$ denote bit lines, $Q_{11}$, $Q_{12}$, $Q_{21}$ and $Q_{22}$ denote first field effect transistors for data storage (hereinafter simply referred to as storing transistors), $C_{11}$, $C_{12}$, $C_{21}$ and $C_{22}$ denote ferroelectric capacitors, $R_{11}$, $R_{12}$, $R_{21}$ and $R_{22}$ denote second field effect transistors for resetting (hereinafter simply referred to as resetting transistors), and $P_{11}$, $P_{12}$, $P_{21}$ and $P_{22}$ denote third field effect transistors for selecting the storing transistors $Q_{11}$, $Q_{12}$, $Q_{21}$ and $Q_{22}$ (hereinafter simply referred to as selecting transistors).

The storing transistor $Q_{11}$, $Q_{12}$, $Q_{21}$ or $Q_{22}$ and the ferroelectric capacitor $C_{11}$, $C_{12}$, $C_{21}$ or $C_{22}$ disposed in the same memory cell together form an MFMIS transistor.

Figure 5A:
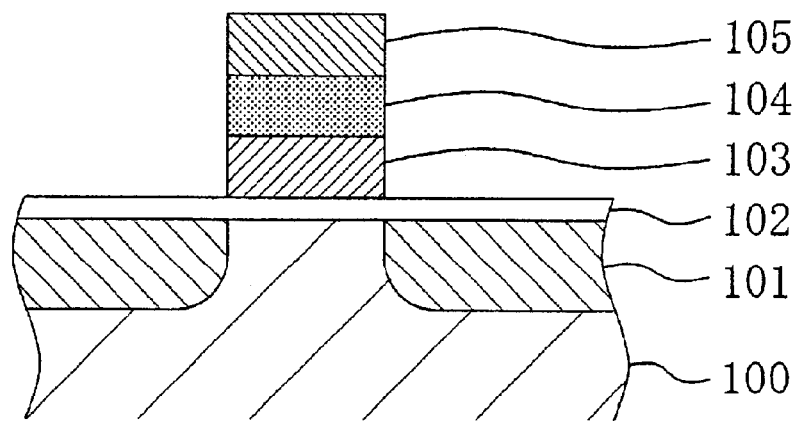
FIG. 5A is a cross-sectional view for showing a first structure of an MFMIS transistor commonly employed in a conventional semiconductor memory and the semiconductor memory of the embodiment and FIG. 5B is a cross-sectional view for showing a second structure of the MFMIS transistor commonly employed in the conventional semiconductor memory and the semiconductor memory of the embodiment.
Figure 5B:
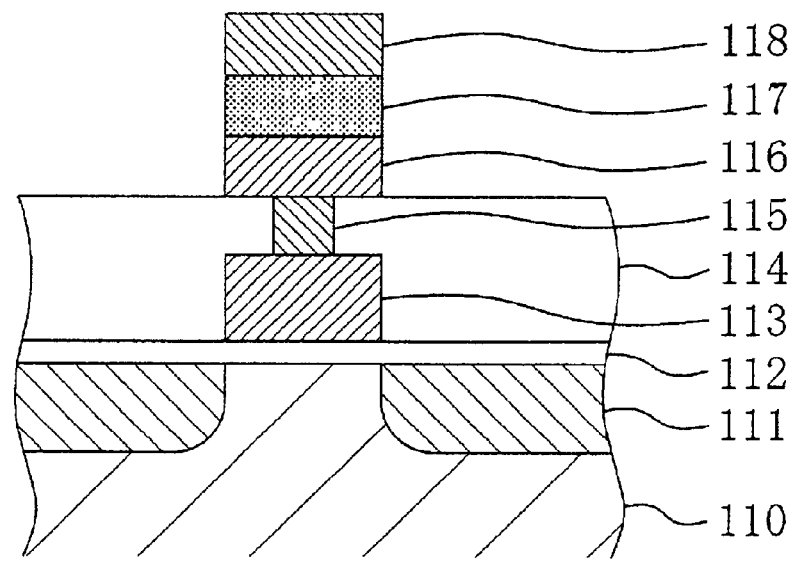

The MFMIS transistor used in this invention may employ the first structure shown in FIG. 5A where the gate electrode of the field effect transistor also works as the lower electrode of the ferroelectric capacitor or the second structure shown in FIG. 5B where the gate electrode of the field effect transistor is electrically connected to the lower electrode of the ferroelectric capacitor.

As shown in FIG. 1, p-type well regions (first well regions) $W_1$ and $W_2$ and n-type well regions (second well regions) $V_1$ and $V_2$ each extending along the column direction of the memory cell array are alternately provided along the row direction. The storing transistor Q is formed in the p-type well region W, and the resetting transistor R and the selecting transistor P are formed in the n-type well region V.

The control gate of the MFMIS transistor (namely, the upper electrode of the ferroelectric capacitor C) is connected to the operation voltage supply line GL through the selecting transistor P, and the gate of the selecting transistor P is connected to the word line WL.

The drain of the storing transistor Q is connected to the bit line BL and the source of the storing transistor Q is connected to the source line SL, so as to read a data on the basis of a potential difference between the bit line BL and the source line SL.

The gate of the storing transistor Q is connected to the drain of the resetting transistor R, the second well region W of the storing transistor Q is connected to the source of the resetting transistor R, and the gate of the resetting transistor R is connected to the reset line RL.

Although the storing transistor Q is formed in the p-type well region W and the resetting transistor R and the selecting transistor P are formed in the n-type well region V in this embodiment, the storing transistor Q may be formed in a well region isolated from another well region where the resetting transistor R and the selecting transistor P are formed.

Now, operations for writing a data in and reading a data from a memory cell disposed at an address 11 (namely, on the first row and in the first column) of the memory cell array composed of the semiconductor memory of this embodiment will be described with reference to FIG. 2.

(Write Operation)

As preparation for a write operation, all the p-type well regions $W_1$ and $W_2$ are grounded ($W_1$=$W_2$=0 V) and the highest voltage among operation voltages, for example, a power voltage $V_p$ of 5 V is applied to all the n-type well regions $V_1$ and $V_2$ ($V_1$=$V_2$=$V_p$).

A data is written in the memory cell at the address 11 as follows:

A voltage of 0 V is applied to the reset line $RL_1$ in the first column, so as to turn on the resetting transistors $R_{11}$ and $R_{21}$ in the first column, and the voltage $V_p$ is applied to the resetting line $RL_2$ in the second column, so as to turn off the resetting transistors $R_{12}$ and $R_{22}$ in the second column. In this manner, the floating gate of the storing transistor Q and the second well region $W_1$ are short-circuited in each memory cell in the first column.

A ground voltage 0 V is applied to all the bit lines $BL_1$ and $BL_2$ and all the source lines $SL_1$ and $SL_2$. In this manner, the floating gate, the p-type well region $W_1$, the drain region and the source region all attain potential of 0 V in each storing transistor Q in the first column.

A ground voltage 0 V is applied to the word line $WL_1$ on the first row, so as to turn on the selecting transistors $P_{11}$ and $P_{12}$ on the first row, and the voltage $V_p$ is applied to the word line $WL_2$ on the second row, so as to turn off the selecting transistors $P_{21}$, and $P_{22}$ on the second row. Under this condition, a voltage $+V_p$ or $-V_p$ corresponding to a binary data is applied to the operation voltage supply line $GL_1$ in the first column, and a ground voltage 0 V is applied to the operation voltage supply line $GL_2$ in the second column.

In this manner, the voltage $+V_p$ or $-V_p$ is applied between the electrodes of the ferroelectric capacitor $C_{11}$ in the memory cell at the address 11, and thus, the polarization of the ferroelectric capacitor $C_{11}$, is overwritten in this memory cell.

In the memory cells on the second row, no data is written because the selecting transistors $P_{21}$, and $P_{22}$ on the second row are off, and in the memory cells in the second column, data are not overwritten because the resetting transistors $R_{12}$ and $R_{22}$ are off and the operation voltage supply line $GL_2$ in the second column is grounded.

(Read Operation)

A voltage $V_p$ is applied to all the reset lines $RL_1$ and $RL_2$, so as to turn off all the resetting transistors $R_{11}$, $R_{12}$, $R_{21}$ and $R_{22}$. In this manner, the ferroelectric capacitors $C_{11}$, $C_{12}$, $C_{21}$ and $C_{22}$ are respectively connected to the storing transistors $Q_{11}$, $Q_{12}$, $Q_{21}$ and $Q_{22}$ so as to form the MFMIS transistors.

Under application of a ground voltage 0 V to all the source lines $SL_1$ and $SL_2$, a voltage $V_d$ (of, for example, 0.6 V) is applied to the bit line $BL_1$ in the first column and a ground voltage 0 V is applied to the bit line $BL_2$ in the second column. Thus, the addresses in the first column are selected.

A ground voltage 0 V is applied to the word line $WL_1$ on the first row, so as to turn on the selecting transistors $P_{11}$, and $P_{12}$ on the first row, and the voltage $V_p$ is applied to the word line $WL_2$ on the second row, so as to turn off the selecting transistors $P_{21}$ and $P_{22}$ on the second row. Thus, the address on the first row is specified.

Furthermore, a voltage $V_r$ (preferably substantially equal to the threshold voltage of the storing transistor $Q_{11}$) is applied to the operation voltage supply line $GL_1$ in the first column and a ground voltage 0 V is applied to the operation voltage supply line $GL_2$ in the second column.

In this manner, the selecting transistors $P_{11}$ and $P_{12}$ on the first row are turned on and the voltage $V_r$ is applied to the operation voltage supply line $GL_1$ in the first column, and hence, the control gate of the MFMIS transistor at the address 11 is turned on. Also, since the voltage $V_d$ is applied between the bit line $BL_1$ and the source line $SL_1$ in the first column, a drain current flows to the storing transistor $Q_{11}$ included in the memory cell at the address 11. At this point, since the potential of the floating gate is varied depending upon whether the polarization of the ferroelectric capacitor $C_{11}$ included in the memory cell at the address 11 is positive or negative (which is determined in accordance with the voltage $\pm V_p$ applied to the operation voltage supply line $GL_1$ in the first column in the write operation). Therefore, the drain current is either large or small, which can be taken out as a binary data.

For a rewrite operation, there is no need to carry out the erase operation but the above-described write operation alone is carried out. In other words, a write operation can be carried out without carrying out an erase operation in this invention.

Figure 3:
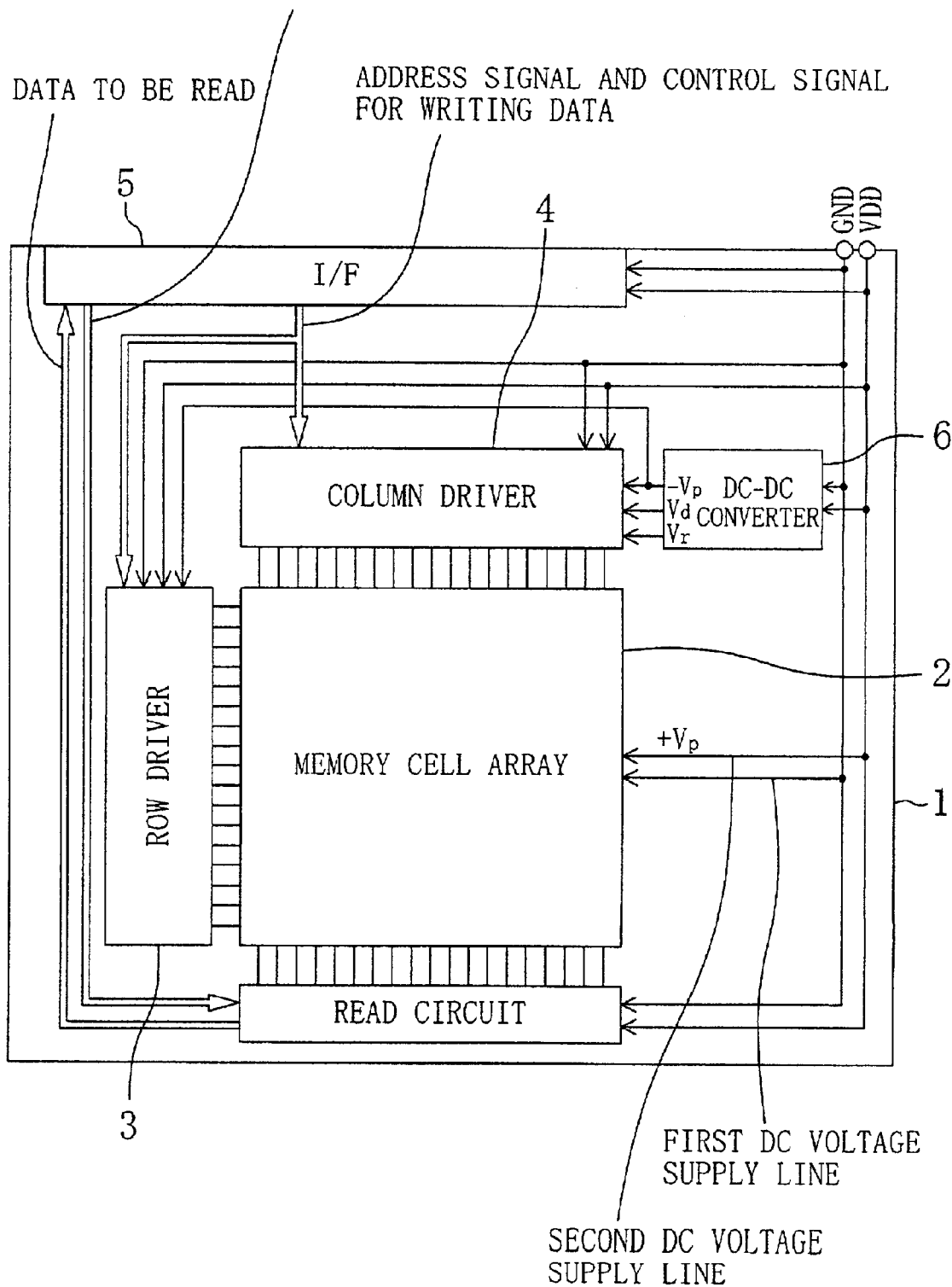
FIG. 3 is a plane view of a semiconductor chip mounting the memory cell array composed of the memory cells each including the semiconductor memory of the embodiment.

FIG. 3 shows the plane structure of a semiconductor chip 1 mounting the memory cell array composed of the semiconductor memory of this embodiment. On the semiconductor chip 1, the memory cell array 2, a row driver 3, a column driver 4, an I/F circuit 5 and a DC-DC converter 6 are formed.

A power voltage introduced from the outside to a VDD terminal on the semiconductor chip 1 and a ground voltage introduced from the outside to a GND terminal on the semiconductor chip 1 are respectively supplied to the row driver 3 and the column driver 4 corresponding to driving circuits for driving the memory cell array 2. The DC-DC converter 6 generates a DC voltage $-V_p$, a DC voltage $V_d$ and a DC voltage $V_r$. The DC voltage $-V_p$ generated by the DC-DC converter 6 is sent to the row driver 3 and the column driver 4, and the DC voltage $V_d$ and the DC voltage $V_r$ generated by the DC-DC converter 6 are sent to the column driver 4.

In the preparation for a write operation, the power voltage $V_p$ introduced to the VDD terminal is directly supplied to the n-type well regions V of the memory cell array 2, and the ground voltage 0 V introduced to the GND terminal is directly supplied to the p-type well regions W of the memory cell array 2.

In this embodiment, since the power voltage introduced to the VDD terminal is directly supplied to the n-type well regions V of the memory cell array 2 as the DC voltage $+V_p$, the DC-DC converter 6 need not generate a DC voltage $+V_p$. Therefore, the area of the DC-DC converter 6 of this embodiment can be smaller than that of a conventional DC-DC converter.

Figure 4:
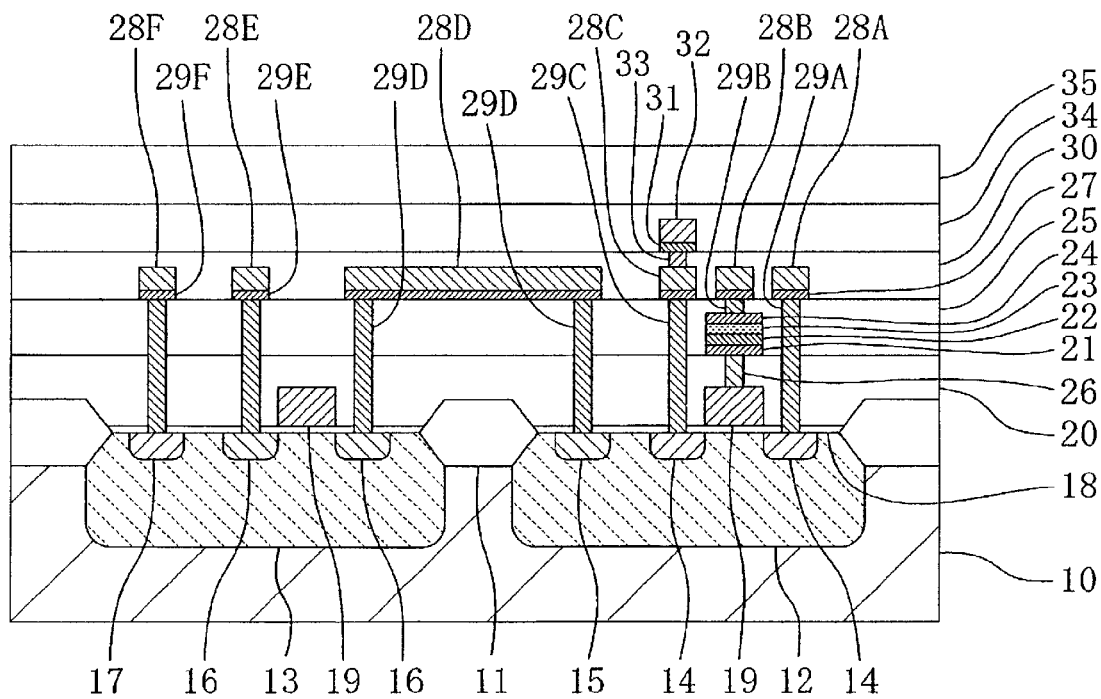
FIG. 4 is a cross-sectional view of the semiconductor memory of the embodiment.

FIG. 4 shows the cross-sectional structure of the semiconductor memory of this embodiment. On a semiconductor substrate 10, an isolation region 11 of $SiO_2$ is formed by the LOCOS method. A p-type well region 12 is formed in a surface portion of the semiconductor substrate 10 where a first field effect transistor Q is to be formed, and an n-type well region 13 is formed in a surface portion of the semiconductor substrate 10 where a second field effect transistor R is to be formed. N-type heavily-doped layers 14 serving as the source and the drain of the first field effect transistor Q and a p-type contact layer 15 of a p-type heavily-doped layer are formed in surface portions of the p-type well region 12. Also, p-type heavily-doped layers 16 serving as the source and the drain of the second field effect transistor R and an n-type contact layer 17 of an n-type heavily-doped layer are formed in surface portions of the n-type well region 13.

A gate electrode 19 of polysilicon is formed above the semiconductor substrate 10 with a gate insulating film 18 of $SiO_2$ sandwiched therebetween, and the gate electrode 19 is covered with a first interlayer insulating film 20 of $SiO_2$.

On the first interlayer insulating film 20, a barrier metal layer 21 of $IrO_2/Ir/TiN$, a lower electrode 22 of Pt, a ferroelectric film 23 of $SrBiTa_2O_9$ and an upper electrode 24 of Pt are successively formed. The lower electrode 22, the ferroelectric film 23 and the upper electrode 24 together form a ferroelectric capacitor C, and the ferroelectric capacitor C is covered with a second interlayer insulating film 25 of $SiO_2$. The barrier metal layer 21 of the ferroelectric capacitor C is connected to the gate electrode 19 of the first field effect transistor Q through a contact plug 26.

Lower interconnects 28A, 28B, 28C, 28D, 28E and 28F of Al are formed above the second interlayer insulating film 26 with a barrier metal layer 27 of TiN sandwiched therebetween. The lower interconnect 28A is connected to one of the n-type heavily-doped layers 14 through a contact plug 29A, the lower interconnect 28B is connected to the upper electrode 24 of the ferroelectric capacitor C through a contact plug 29B, the lower interconnect 28C is connected to the other of the n-type heavily-doped layers 14 through a contact plug 29C, the lower interconnect 28D is connected to the p-type contact layer 15 at one end thereof through a contact plug 29D and is connected to one of the p-type heavily-doped layers 16 at the other end thereof through another contact plug 29D, the lower interconnect 28E is connected to the other of the p-type heavily-doped layers 16 through a contact plug 29E, and the lower interconnect 28F is connected to the n-type contact layer 17 through a contact plug 29F.

The barrier metal layer 27 and the lower interconnects 28A, 28B, 28C, 28D, 28E and 28F are covered with a third interlayer insulating film 30 of $SiO_2$. An upper interconnect 32 of Al is formed above the third interlayer insulating film 30 with a barrier metal layer 31 of TiN sandwiched therebetween, and the upper interconnect 32 is connected to the lower interconnect 28C through a contact plug 33.

The upper interconnect 32 is covered with a first protection film 34 of $SiO_2$, and a second protection film 35 of $SiN_x$ is formed on the first protection film 34.

What is claimed is:

1. A semiconductor memory comprising:
   an MFMIS transistor including a first field effect transistor and a ferroelectric capacitor formed on or above said first field effect transistor with a gate electrode of said first field effect transistor working as or being electrically connected to a lower electrode of said ferroelectric capacitor, an upper electrode of said ferroelectric capacitor working as a control gate and said first field effect transistor having a first well region; and
   a second field effect transistor having a second well region that is isolated from said first well region of said first field effect transistor,
   wherein said first well region of said first field effect transistor is electrically connected to a source region of said second field effect transistor, and
   said gate electrode of said first field effect transistor is electrically connected to a drain region of said second field effect transistor.

2. The semiconductor memory of claim 1,
   wherein said first field effect transistor, said second field effect transistor and a driving circuit for driving said first and second field effect transistors are formed on one semiconductor substrate, and
   a driving voltage supplied to said driving circuit and a DC voltage supplied to said second well region of said second field effect transistor are supplied from one voltage supply.

3. The semiconductor memory of claim 1,
   wherein said first well region of said first field effect transistor and said second well region of said second field effect transistor have different conductivity types.

4. A method for driving a semiconductor memory composed of an MFMIS transistor including a first field effect transistor and a ferroelectric capacitor formed on or above said first field effect transistor with a gate electrode of said first field effect transistor working as or being electrically connected to a lower electrode of said ferroelectric capacitor, an upper electrode of said ferroelectric capacitor working as a control gate and said first field effect transistor having a first well region, and a second field effect transistor having a second well region that is isolated from said first well region of said first field effect transistor, said first well region of said first field effect transistor being electrically connected to a source region of said second field effect transistor and said gate electrode of said first field effect transistor being electrically connected to a drain region of said second field effect transistor, comprising the steps of:

writing a data in said MFMIS transistor by applying a voltage between said control gate and said first well region of said first field effect transistor with said second field effect transistor placed in an on-state; and reading a data from said MFMIS transistor by detecting change of channel resistance of said first field effect transistor with said second field effect transistor placed in an off-state.

5. The method for driving a semiconductor memory of claim 4, wherein a driving voltage supplied to a driving circuit for driving said first and second field effect transistors and a DC voltage supplied to said second well region of said second field effect transistor are supplied by one voltage supply.

6. The method for driving a semiconductor memory of claim 4, wherein said first well region and said second well region have different conductivity types.

* * * * *